(12) United States Patent
Lin et al.

(10) Patent No.: US 10,021,813 B2
(45) Date of Patent: Jul. 10, 2018

(54) THERMAL MODULE ASSEMBLING STRUCTURE

(71) Applicant: ASIA VITAL COMPONENTS CO., LTD., New Taipei (TW)

(72) Inventors: Yuan-Yi Lin, New Taipei (TW); Yen-Lin Chu, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 352 days.

(21) Appl. No.: 14/882,387

(22) Filed: Oct. 13, 2015

(65) Prior Publication Data
US 2017/0105316 A1 Apr. 13, 2017

(51) Int. Cl.
*F28F 7/00* (2006.01)
*H05K 7/20* (2006.01)

(52) U.S. Cl.
CPC ............................ *H05K 7/20418* (2013.01)

(58) Field of Classification Search
CPC ........ H05K 7/20418; F28D 2021/0028; F28D 2021/0029; H01L 23/40; H01L 23/46; H01L 23/4093
USPC ........................................................ 165/80.3
See application file for complete search history.

(56) References Cited

U.S. PATENT DOCUMENTS

| | | | | |
|---|---|---|---|---|
| 5,870,287 A * | 2/1999 | Rodriguez | .......... | H01L 23/4093 165/80.2 |
| 6,209,623 B1 * | 4/2001 | Tantoush | ............ | H01L 23/4006 165/80.3 |
| 6,618,253 B1 * | 9/2003 | Szu | ...................... | H01L 23/4093 257/719 |
| 6,795,317 B1 * | 9/2004 | Liu | ...................... | H01L 23/4093 165/80.3 |
| 7,110,261 B2 * | 9/2006 | Lee | ...................... | H01L 23/4093 165/185 |
| 9,382,938 B2 * | 7/2016 | Hayashi | .................. | F16B 43/00 |
| 9,572,244 B1 * | 2/2017 | Lin | ...................... | H05K 1/0203 |
| 2005/0024832 A1 * | 2/2005 | Lee | ..................... | H01L 23/4093 361/704 |
| 2005/0141201 A1 * | 6/2005 | Chen | ................... | H01L 23/4093 361/704 |

(Continued)

FOREIGN PATENT DOCUMENTS

| | | |
|---|---|---|
| TW | 437989 | 5/2001 |
| TW | 201322901 | 6/2013 |
| TW | M481438 | 7/2014 |

*Primary Examiner* — Claire Rojohn, III
(74) *Attorney, Agent, or Firm* — Jackson IPG PLLC; Demian K. Jackson

(57) ABSTRACT

A thermal module assembling structure includes a heat sink, at least one leaf spring, at least one holding member and a shaft rod. The heat sink has a base seat and multiple radiating fins disposed on the base seat. At least one perforation is formed on each of two opposite sides of the base seat. The heat sink is correspondingly assembled on the leaf spring. At least one engagement post is disposed on the leaf spring corresponding to the perforation. The holding member is slidably capped on the engagement post and has a first end and a second end. The second end is formed with a socket having an internal receiving space in which a raised section is formed. The engagement post is inlaid in the receiving space. The shaft rod passes through the heat sink. Two ends of the shaft rod are respectively connected with the engagement posts.

9 Claims, 13 Drawing Sheets

(56) References Cited

U.S. PATENT DOCUMENTS

| | | | |
|---|---|---|---|
| 2005/0201064 A1* | 9/2005 | Chen | H01L 23/4093 361/719 |
| 2008/0273302 A1* | 11/2008 | Lin | G06F 1/20 361/679.54 |
| 2008/0273309 A1* | 11/2008 | Lin | H01L 23/4093 361/718 |
| 2009/0217496 A1* | 9/2009 | Lin | H01L 23/4093 24/485 |
| 2010/0122796 A1* | 5/2010 | Guo | F28D 15/0266 165/80.3 |
| 2010/0296255 A1* | 11/2010 | Maloney | H01L 23/4093 361/720 |
| 2010/0321894 A1* | 12/2010 | Wang | H01L 23/4093 361/709 |
| 2011/0032680 A1* | 2/2011 | Zhao | H01L 23/4093 361/720 |
| 2011/0155408 A1* | 6/2011 | Li | B65H 75/48 174/50 |
| 2012/0216988 A1* | 8/2012 | Kang | H01L 23/4093 165/67 |
| 2014/0106605 A1* | 4/2014 | Yeh | H01R 13/533 439/487 |
| 2014/0352919 A1* | 12/2014 | Lin | F28F 9/26 165/76 |
| 2014/0362538 A1* | 12/2014 | Su | H01L 23/4093 361/720 |
| 2015/0296654 A1* | 10/2015 | Lin | H05K 7/2039 361/709 |
| 2015/0296663 A1* | 10/2015 | Lin | F28F 99/00 165/185 |

* cited by examiner

THERMAL MODULE ASSEMBLING STRUCTURE

BACKGROUND OF THE INVENTION

1. Field of the Invention

The present invention relates generally to a thermal module assembling structure, and more particularly to a thermal module assembling structure, which can greatly shorten working time and facilitate the assembling process.

2. Description of the Related Art

In the recent years, along with the rapid advance of computer sciences and technologies, the operation speed of the computer has become faster and faster and the heat generation power of the electronic components in the computer host also has become higher and higher. Therefore, it has become a very critical issue how to provide sufficient heat dissipation performance for the electronic components in the computer so as to avoid overheating of the electronic components and prevent the electronic components from temporarily or permanently failing.

With a central processing unit (CPU) taken as an example, in operation, once the temperature of the CPU exceeds the normal working temperature range, it is extremely possible for the CPU to mis-operate or temporarily fail. This will lead to crash of the computer host. Moreover, in case the temperature of the CPU far exceeds the normal working temperature range, the transistors in the CPU chip are extremely possible to damage. This will cause permanent failure of the CPU. Under such circumstance, it is necessary to replace the CPU for restoring the normal operation of the computer host.

The conventional thermal module structure mainly includes two parts, that is, the heat sink and the cooling fan. The heat sink has two thermal contact faces. The first thermal contact face is a heat conduction face between the heat generation electronic component and the bottom of the heat sink. The second thermal contact face is a heat convection face between the radiating fins of the heat sink and the cooling fan. In order to achieve maximum heat conduction efficiency, the heat conduction face of the bottom of the heat sink must be tightly attached to the heat generation electronic component. Otherwise, no matte how high the performance of the thermal module is, in the case that a gap exists between the heat conduction face of the bottom of the heat sink and the heat generation electronic component, the heat dissipation efficiency of the thermal module will be greatly lowered.

On one hand, a thermal module latch device is used to securely fix the thermal module on the heat generation electronic component. On the other hand, the thermal module latch device is used to make the bottom of the heat sink in tight contact with the heat generation electronic component so as to achieve maximum heat conduction efficiency. However, the conventional thermal module latch device has a complicated structure and includes numerous parts that must be assembled one by one. Therefore, the assembling process is time-consuming and the labor cost is very high. Also, the assembling process is quite troublesome and complicated. When assembled and installed, a user or an operator must first place the heat dissipation unit (heat sink) onto the heat generation electronic component and then latch the heat dissipation unit with the latch device or other latching components one by one so as to connect the heat dissipation unit with the heat generation electronic component. When detached, a reverse process is performed. Therefore, in practice, it is inconvenient and troublesome to use and assemble the conventional thermal module latch device. According to the above, the conventional thermal module latch device has some shortcomings as follows:

1. The conventional thermal module latch device has a complicated structure, which is quite troublesome and inconvenient to install or detach.
2. The assembling working time of the conventional thermal module latch device is greatly increased.

SUMMARY OF THE INVENTION

It is therefore a primary object of the present invention to provide a thermal module assembling structure, which can greatly shorten assembling working time.

It is a further object of the present invention to provide the above thermal module assembling structure, which can greatly facilitate the assembling process.

To achieve the above and other objects, the thermal module assembling structure of the present invention includes a heat sink, at least one leaf spring, at least one holding member and a shaft rod. The heat sink has a base seat and multiple radiating fins disposed on the base seat. At least one perforation is formed on each of two opposite sides of the base seat. The heat sink is correspondingly assembled on the leaf spring. At least one engagement post is disposed on the leaf spring corresponding to the perforation. The holding member is slidably capped on the engagement post and has a first end and a second end. The second end is formed with a socket having an internal receiving space in which a raised section is formed. The engagement post is inlaid in the receiving space. The shaft rod passes through the heat sink. Two ends of the shaft rod are respectively connected with the engagement posts.

The thermal module assembling structure further includes a substrate. A heat source is positioned at the center of the substrate. The heat sink is correspondingly assembled on the leaf spring. The bottom of the heat sink is in contact with the heat source. The holding member is slidably capped on the engagement post with the top end of the engagement post inlaid in the holding member, and the raised section of the holding member contacts the engagement post. Therefore, when an external force is applied to the first end of the holding member to shift the first end downward, the holding member is rotated so that the raised section of the holding member will drive the engagement post and pull the engagement post upward. At the same time, the leaf spring is driven and pulled upward, whereby an upward action force is applied to the leaf spring to make the heat sink tightly abut against the heat source. Accordingly, by means of the relative slide and cooperation between the holding member and the engagement post, the heat sink can be easily mounted on the substrate into tight contact with the heat source. The present invention is advantageous in that a user or an operator can barehanded operate to detach/assemble the thermal module. Therefore, the working time is greatly shortened and the assembling process is facilitated. The present invention eliminates the shortcoming of the conventional thermal module latch device that the latch device has a complicated structure and includes numerous components that must be troublesomely assembled with the thermal module one by one for tightly attaching the thermal module to the heat source so that the assembling process is time-consuming and the cost is high.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
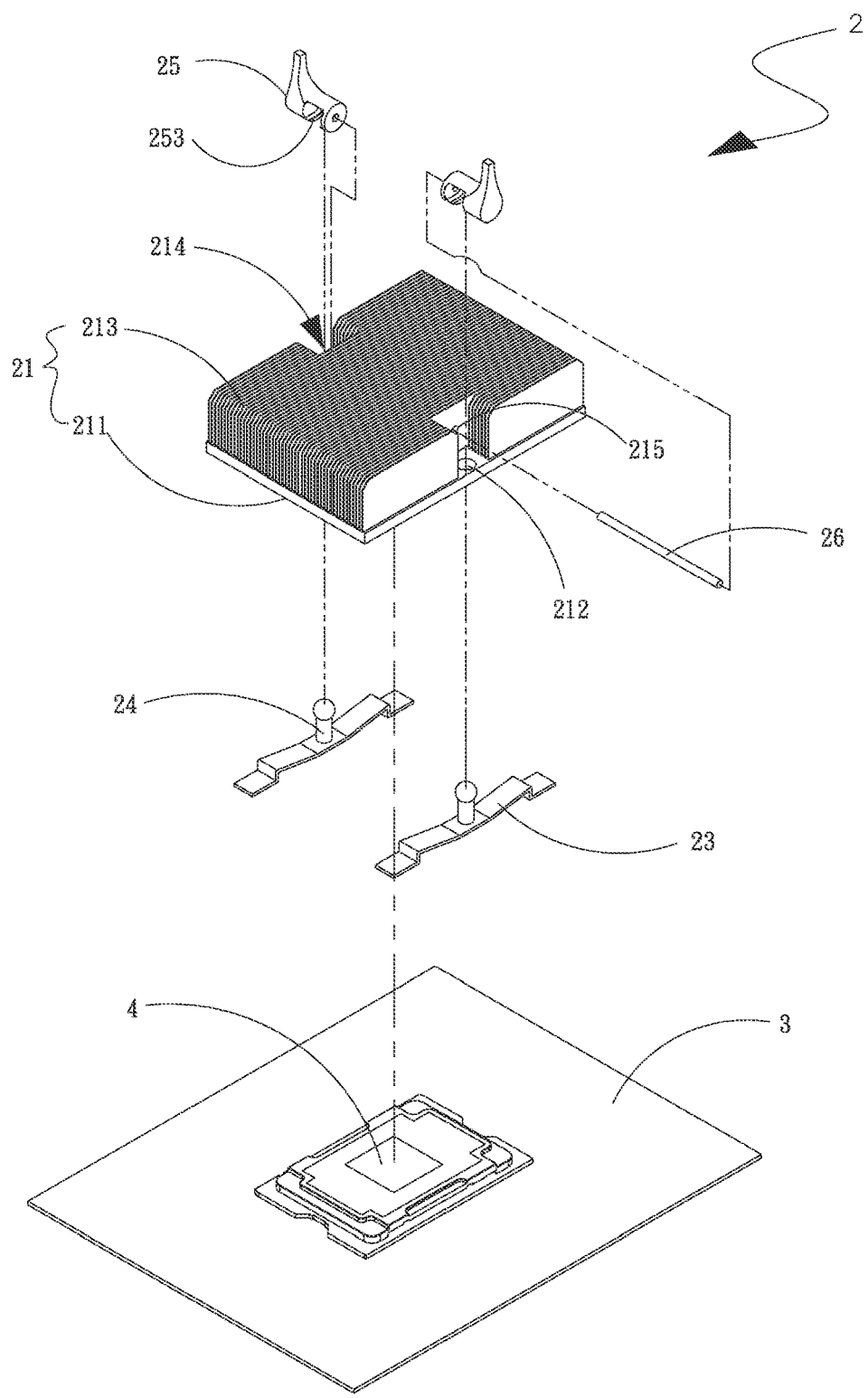
FIG. 1 is a perspective exploded view of a first embodiment of the thermal module assembling structure of the present invention.
Figure 2A:
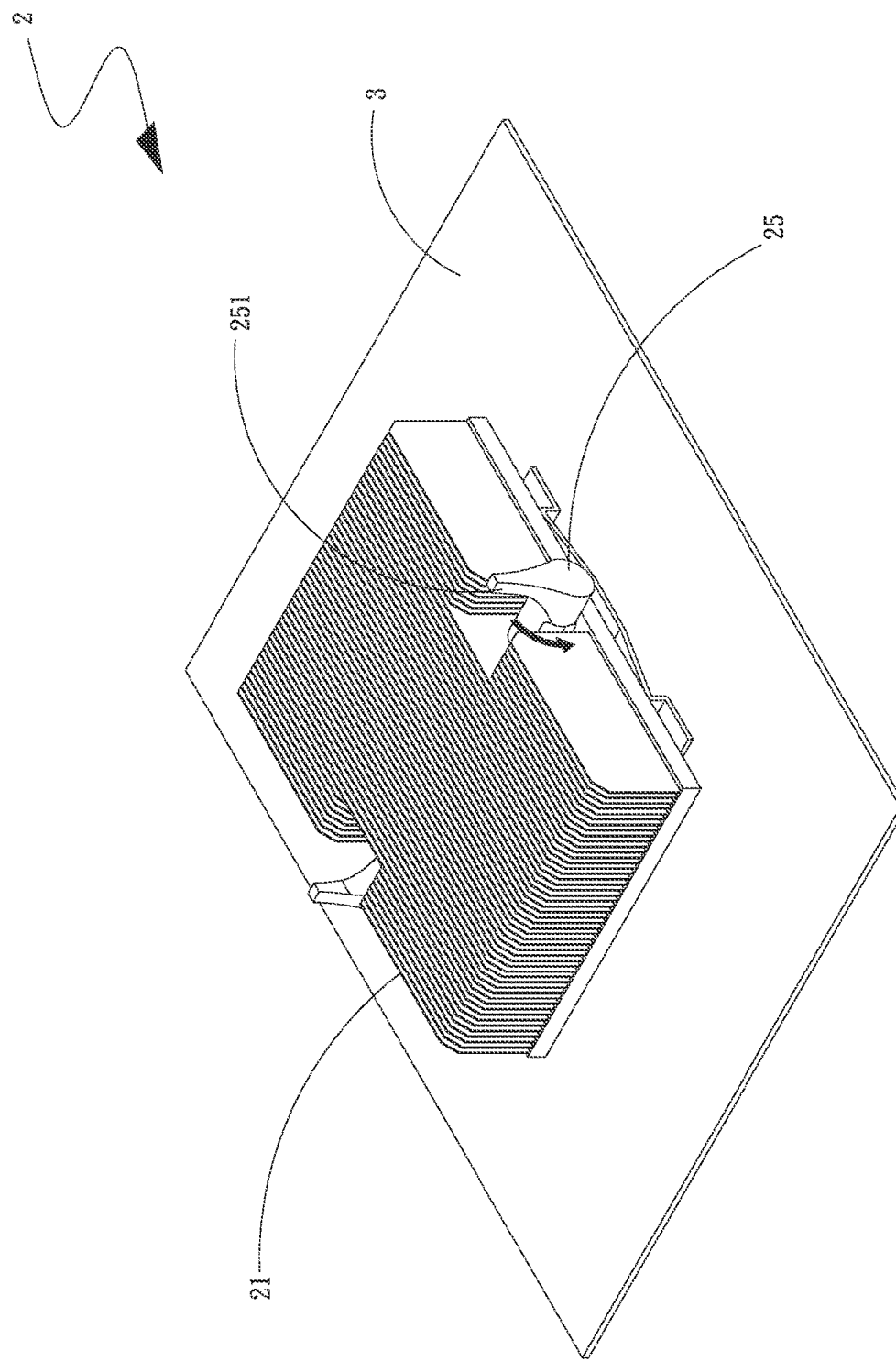
FIG. 2A is a perspective assembled view of the first embodiment of the thermal module assembling structure of the present invention.
Figure 2B:
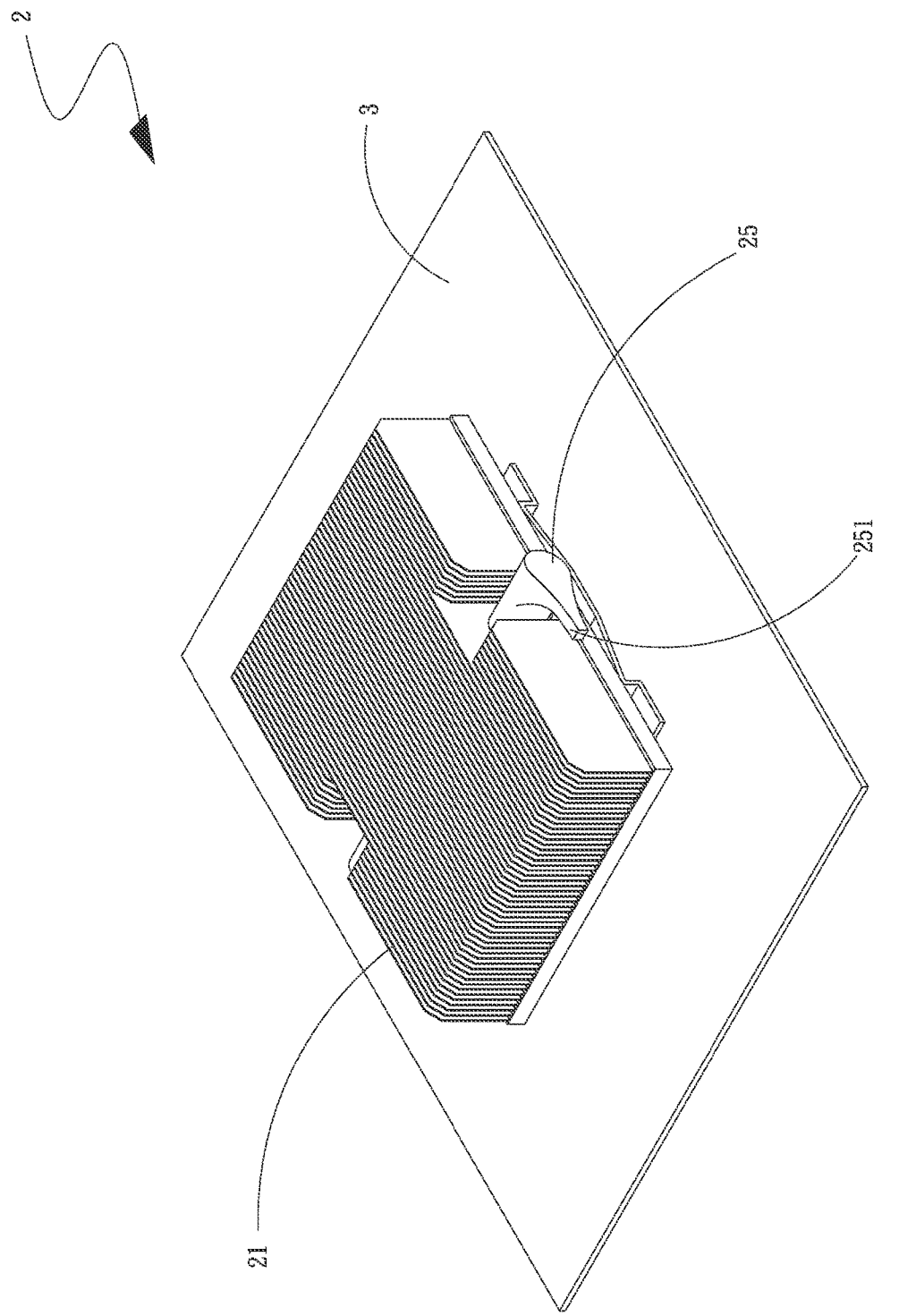
FIG. 2B is another perspective assembled view of the first embodiment of the thermal module assembling structure of the present invention.
Figure 3:
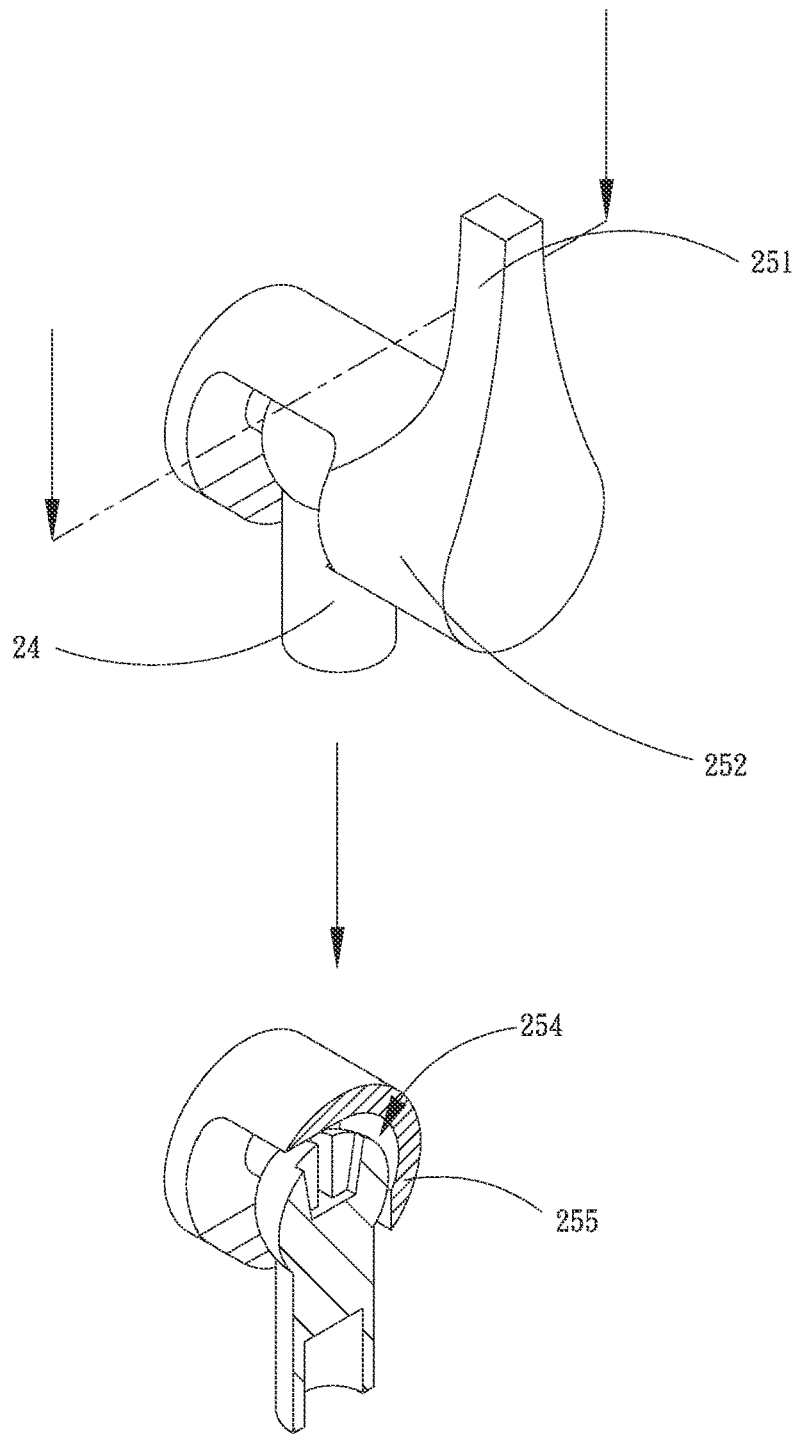
FIG. 3 is a sectional view of the first embodiment of the thermal module assembling structure of the present invention.

Please refer to FIGS. 1, 2A, 2B and 3. FIG. 1 is a perspective exploded view of a first embodiment of the thermal module assembling structure of the present invention. FIG. 2A is a perspective assembled view of the first embodiment of the thermal module assembling structure of the present invention. FIG. 2B is another perspective assembled view of the first embodiment of the thermal module assembling structure of the present invention. FIG. 3 is a sectional view of the first embodiment of the thermal module assembling structure of the present invention. According to the first embodiment, the assembling structure of the thermal module 2 of the present invention includes a heat sink 21, at least one leaf spring 23, at least one holding member 25 and a shaft rod 26. The heat sink 21 has a base seat 211 and multiple radiating fins 213 disposed on one face of the base seat 211. Each of two opposite sides of the heat sink 21 is formed with a recess 214. At least one perforation 212 is formed on the base seat 211 in a position where the recess 214 is formed. The other face of the base seat 211 opposite to the radiating fins 213 is in contact with a heat source 4.

The leaf spring 23 is mounted on a substrate 3. The heat sink 21 is correspondingly assembled on the leaf spring 23. At least one engagement post 24 is disposed on the leaf spring 23 corresponding to the perforation 212. In addition, the heat sink 21 is formed with a shaft hole 215 passing through the radiating fins 213. The shaft rod 26 passes through the shaft hole 215 to connect with the heat sink 21. Two ends of the shaft rod 26 are respectively connected with the engagement posts 24.

The engagement post 24 has a top end slidably inlaid in the holding member 25. The holding member 25 has a first end 251 and a second end 252. The second end 252 is formed with a socket 253 having an internal receiving space 254. A raised section 255 is formed in the receiving space 254 of the holding member 25. The engagement post 24 is inlaid in the receiving space 254.

Figure 4:
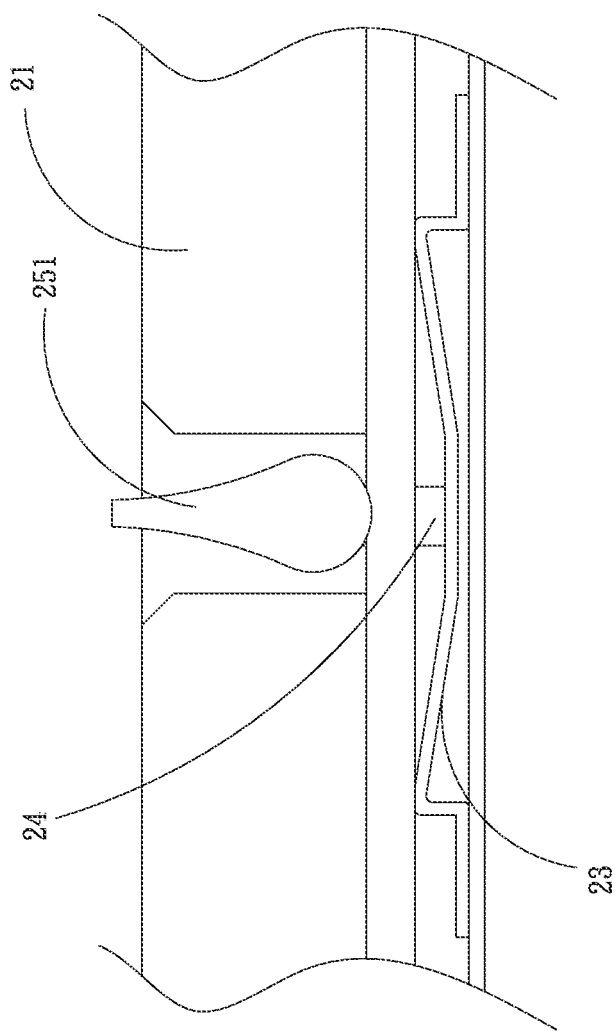
FIG. 4 is a side view of the first embodiment of the thermal module assembling structure of the present invention.
Figure 5:
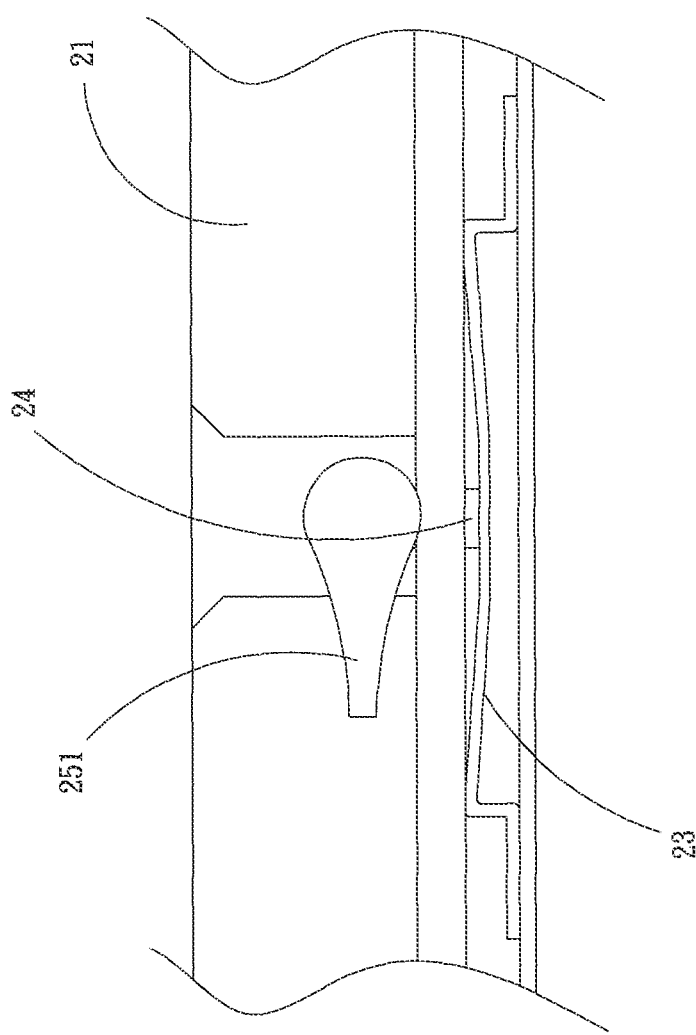
FIG. 5 is another side view of the first embodiment of the thermal module assembling structure of the present invention.
Figure 6:
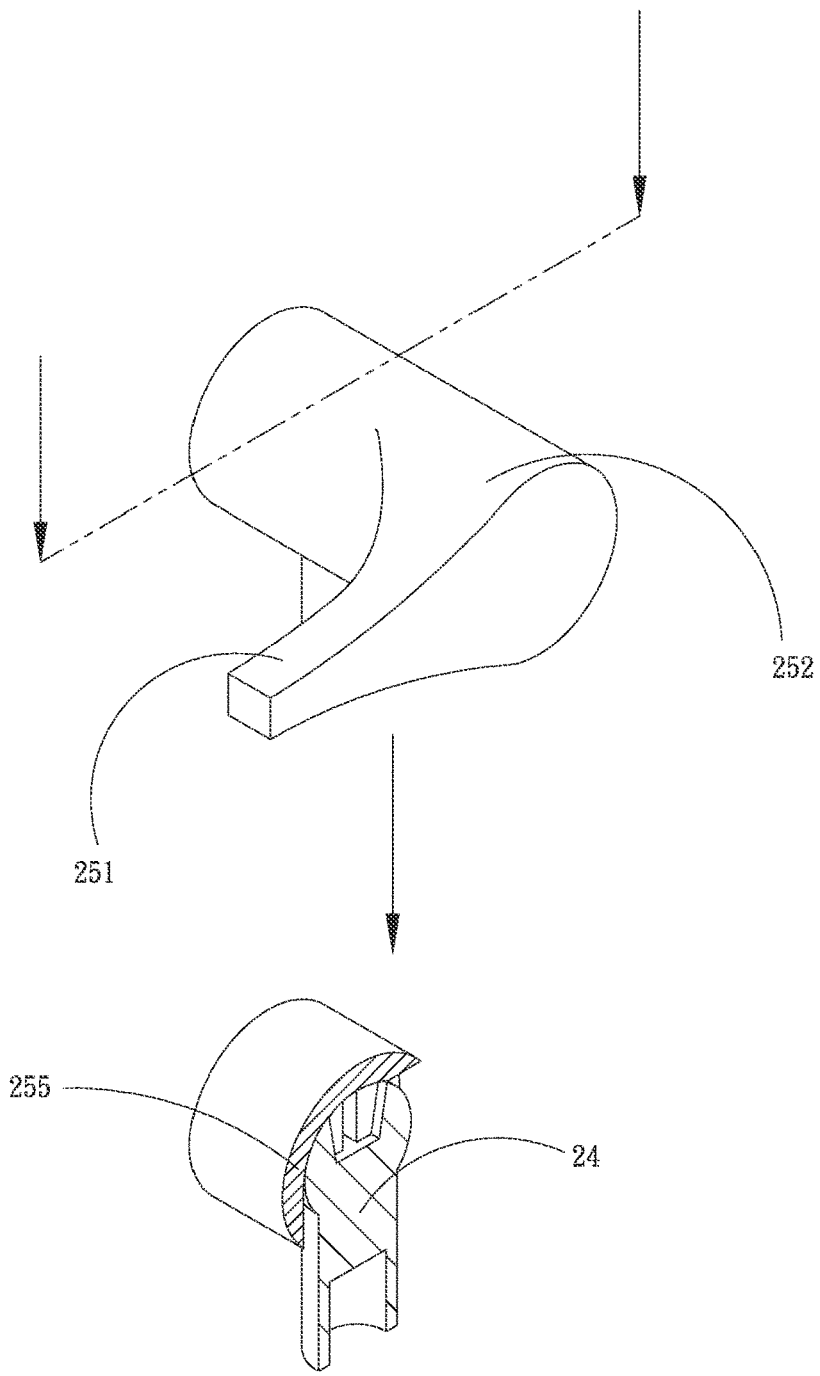
FIG. 6 is another sectional view of the first embodiment of the thermal module assembling structure of the present invention.

Please now refer to FIGS. 4, 5 and 6. FIG. 4 is a side view of the first embodiment of the thermal module assembling structure of the present invention. FIG. 5 is another side view of the first embodiment of the thermal module assembling structure of the present invention. FIG. 6 is another sectional view of the first embodiment of the thermal module assembling structure of the present invention. Also referring to FIG. 1, according to the above arrangement, the holding member 25 is slidably capped on the engagement post 24 with the top end of the engagement post 24 inlaid in the holding member 25, and the raised section 255 of the holding member 25 contacts the engagement post 24. Therefore, when an external force is applied to the first end 251 of the holding member 25 to shift the first end 251 downward, the holding member 25 is rotated so that the raised section 255 of the holding member 25 will drive the engagement post 24 and pull the engagement post 24 upward. At the same time, the leaf spring 23 is driven and pulled upward, whereby an upward action force is applied to the leaf spring 23 to make the heat sink 21 tightly abut against the heat source 4. Accordingly, by means of the relative slide and cooperation between the holding member 25 and the engagement post 24, the heat sink 21 can be easily mounted on the substrate 3 into tight contact with the heat source 4. The present invention is advantageous in that a user or a field assembling worker can barehanded operate to detach/assemble the thermal module 2. Therefore, the working time is greatly shortened and the assembling process is facilitated. The present invention eliminates the shortcoming of the conventional thermal module latch device that the latch device has a complicated structure and includes numerous components that must be troublesomely assembled one by one for tightly attaching the thermal module to the heat source so that the assembling process is time-consuming and the cost is high.

Figure 7:
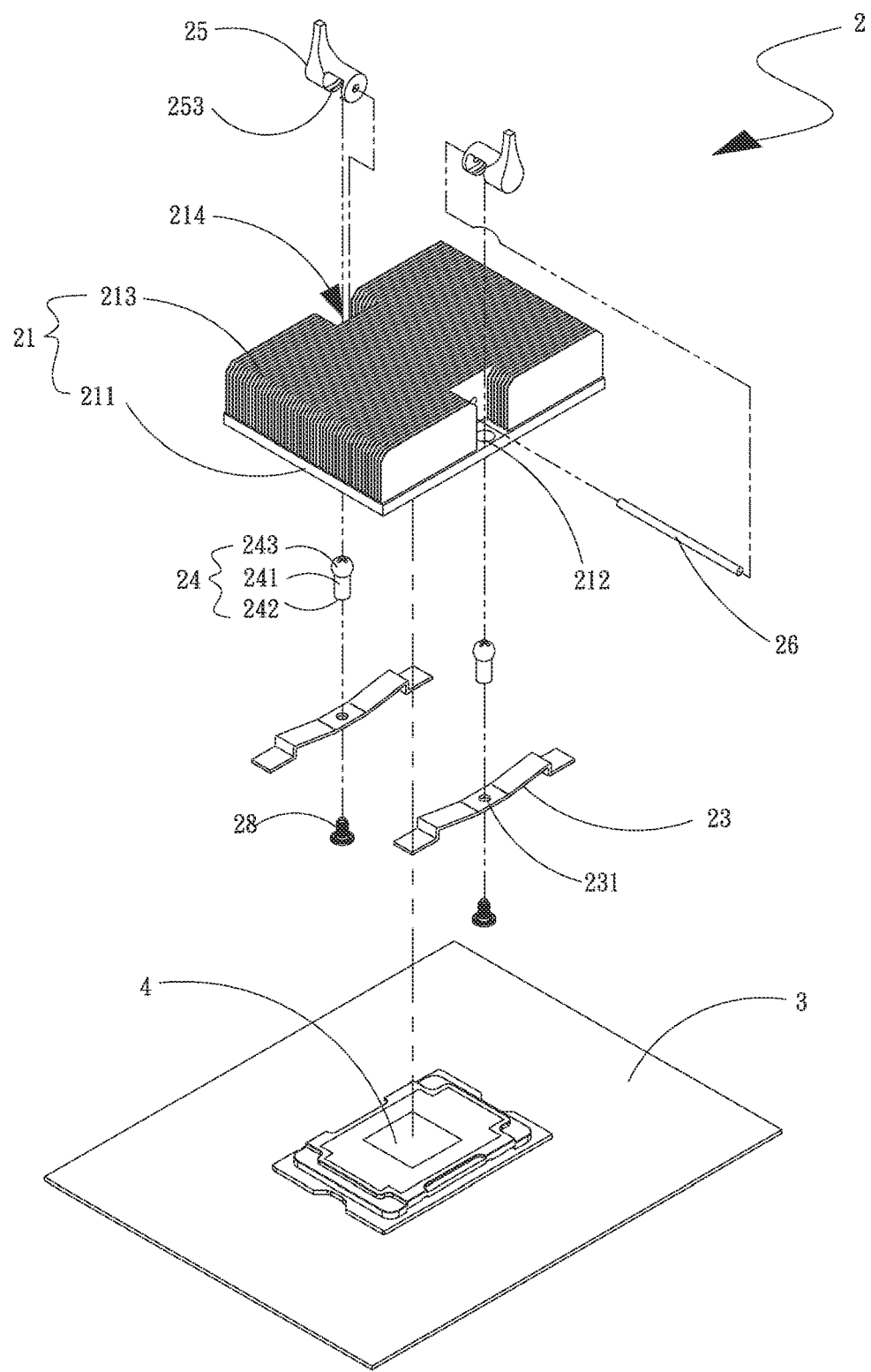
FIG. 7 is a perspective exploded view of a second embodiment of the thermal module assembling structure of the present invention.

Please now refer to FIG. 7, which is a perspective exploded view of a second embodiment of the thermal module assembling structure of the present invention. The second embodiment is partially identical to the first embodiment in component and relationship between the components and thus will not be repeatedly described. The second embodiment is mainly different from the first embodiment in that the leaf spring 23 is formed with at least one hole 231 corresponding to the perforation 212. The engagement post 24 has a main body 241. Two ends of the main body 241 are respectively a fixed end 242 and a free end 243. The fixed end 242 is connected with an assembling member 28 and correspondingly connected to the hole 231 of the leaf spring 23. The free end 243 is correspondingly passed through the perforation 212 of the base seat 211 and slidably inlaid in the holding member 25. The holding member 25 is slidably capped on the engagement post 24 with the free end 243 of the engagement post 24 inlaid in the holding member 25, and the raised section 255 of the holding member 25 contacts the free end 243 of the engagement post 24. Therefore, when an external force is applied to the first end 251 of the holding member 25 to shift the first end 251 downward, the holding member 25 is rotated so that the raised section 255 of the holding member 25 will drive the free end 243 of the engagement post 24 and pull the engagement post 24 upward. At the same time, the leaf spring 23 is driven and pulled upward, whereby an upward action force is applied to the leaf spring 23 to make the heat sink 21 tightly abut against the heat source 4. Accordingly, by means of the relatively slidable contact and cooperation between the raised section 255 and the free end 243, the heat sink 21 can be easily mounted on the substrate 3 into tight contact with the heat source 4. The present invention is advantageous in that an operator can barehanded operate to detach/assemble the thermal module 2. Therefore, the working time is greatly shortened and the assembling process is facilitated. The present invention eliminates the shortcoming of the conventional thermal module latch device that the latch device has a complicated structure and includes numerous components that must be troublesomely assembled with the thermal module one by one for tightly attaching the thermal module to the heat source so that the assembling process is time-consuming and the cost is high.

Figure 8:
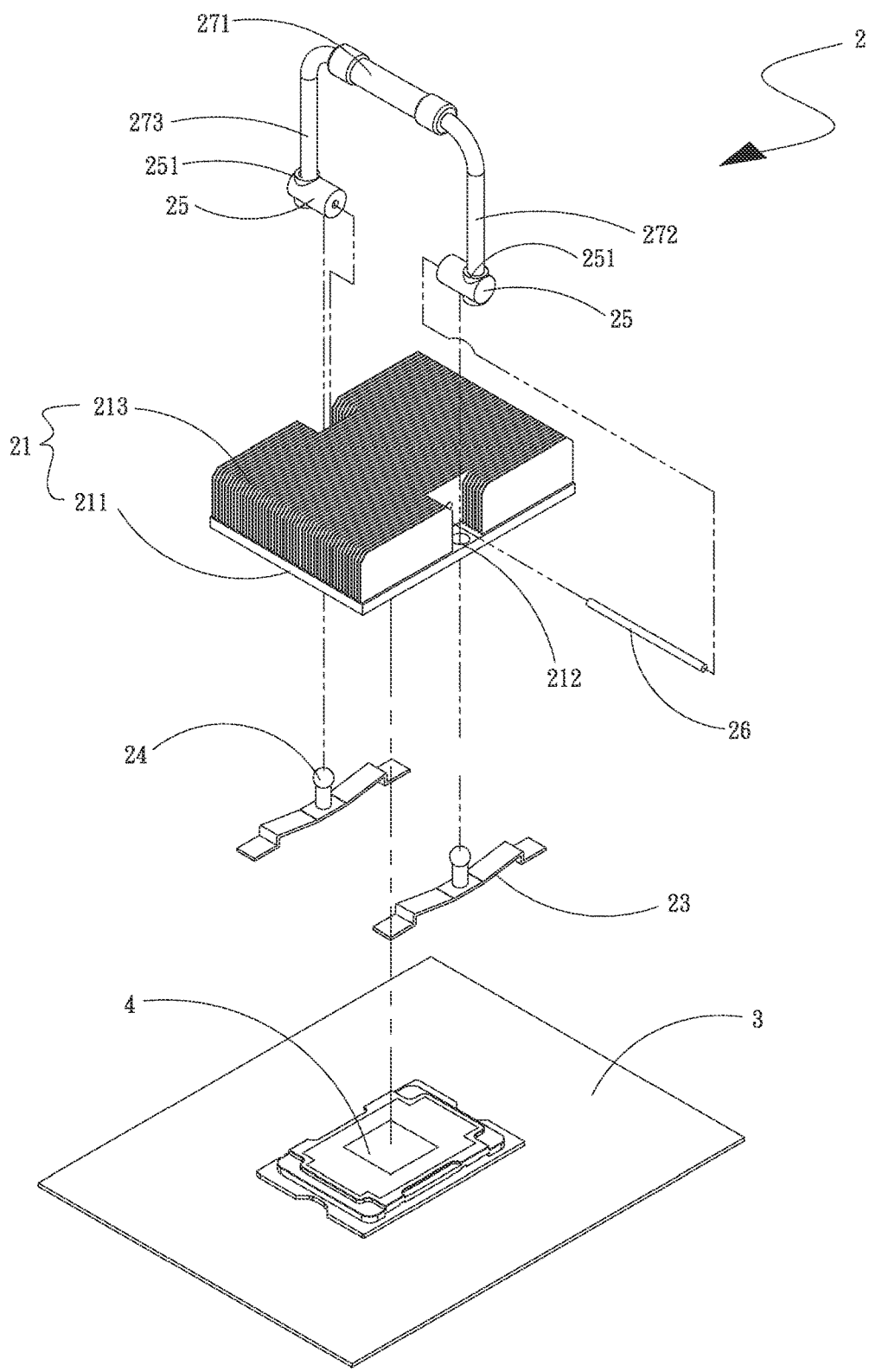
FIG. 8 is a perspective exploded view of a third embodiment of the thermal module assembling structure of the present invention.
Figure 9A:
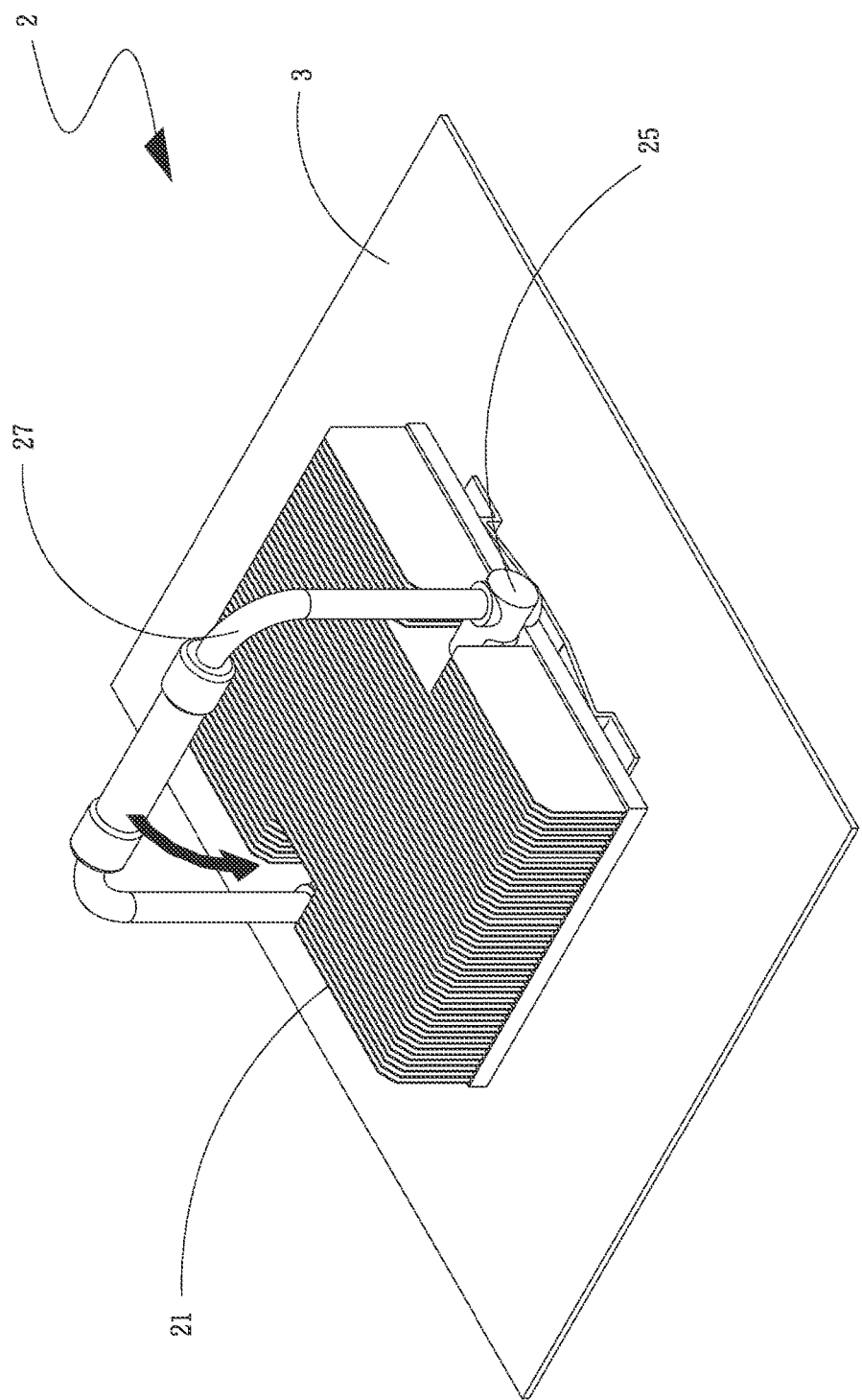
FIG. 9A is a perspective assembled view of the third embodiment of the thermal module assembling structure of the present invention.
Figure 9B:
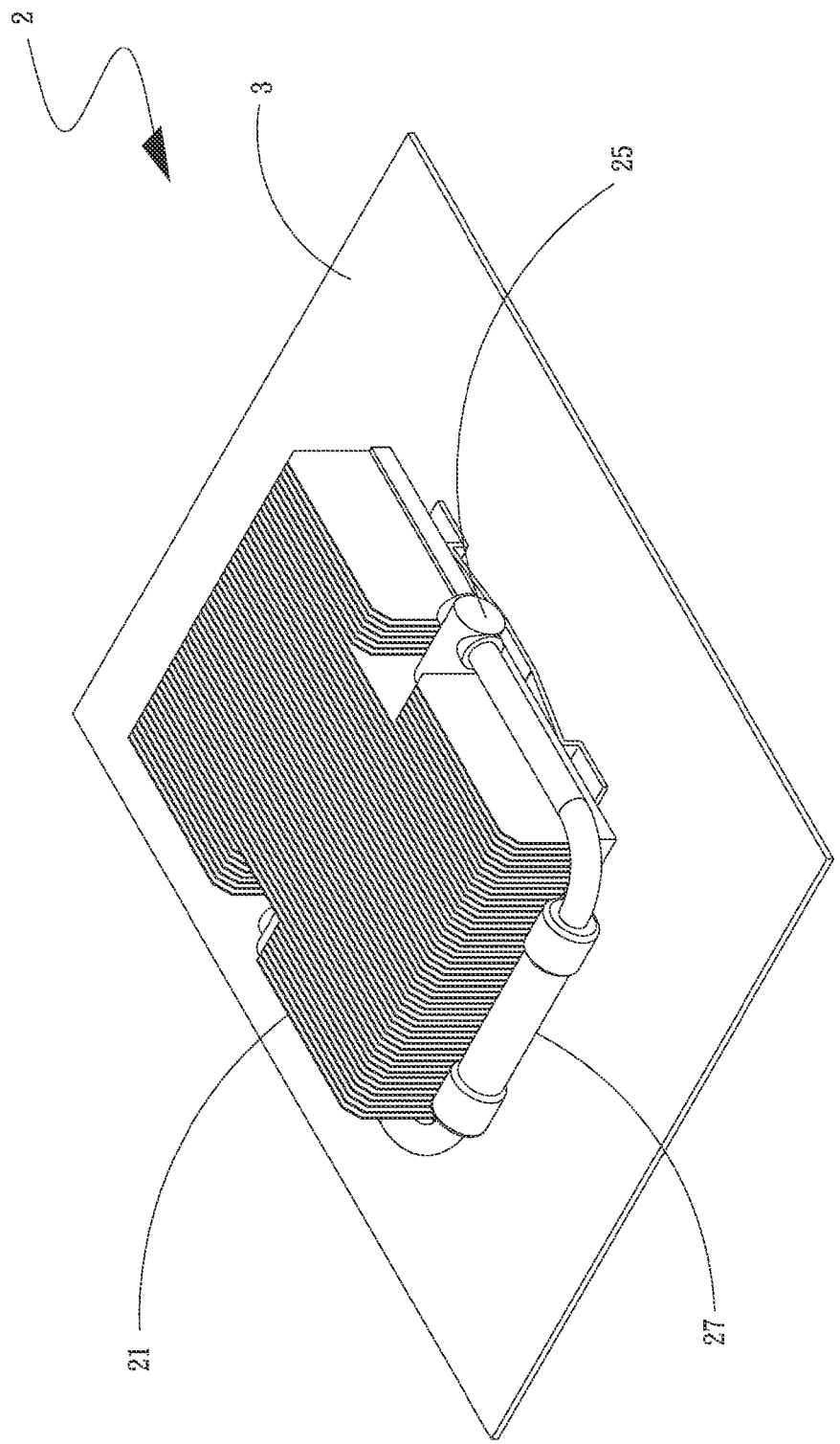
FIG. 9B is another perspective assembled view of the third embodiment of the thermal module assembling structure of the present invention.

Please now refer to FIGS. 8, 9A and 9B. FIG. 8 is a perspective exploded view of a third embodiment of the thermal module assembling structure of the present invention. FIG. 9A is a perspective assembled view of the third embodiment of the thermal module assembling structure of the present invention. FIG. 9B is another perspective assembled view of the third embodiment of the thermal module assembling structure of the present invention. The third embodiment is partially identical to the first embodiment in component and relationship between the components and thus will not be repeatedly described. The third embodiment is mainly different from the first embodiment in that the thermal module 2 further includes a connection member 27 connected with the first ends 251 of the holding members 25. In this embodiment, the connection member 27 is, but not limited to, U-shaped. In practice, the connection member 27 can have any configuration that can connect the first ends 251 of the two holding members 25 arranged on two sides of the heat sink. For example, the connection member 27 can be C-shaped or otherwise shaped to achieve the same effect.

The connection member 27 has a grip section 271 in the middle. A first connection section 272 and a second connection section 273 respectively outward extend from two ends of the grip section 271. The first and second connection sections 272, 273 are respectively connected with the first ends 251 of the two holding members 25 arranged on two sides of the heat sink 21.

According to the above arrangement, by means of the relative slide and cooperation between the engagement posts 24 and the holding members 25, a user can barehanded hold the grip section 271 and apply an external force to the grip section 271 to shift the connection member 27 downward. As aforesaid, the raised sections 255 of the holding members are in contact with the engagement posts 24. Therefore, when the connection member 27 is shifted downward, the holding members 25 are rotated and the raised sections 255 will drive the engagement posts 24 and pull the engagement posts 24 upward. At the same time, the leaf springs 23 are driven and pulled upward, whereby an upward action force is applied to the leaf springs 23 to make the heat sink 21 tightly abut against the heat source 4. Accordingly, a user can barehanded operate to detach/assemble the thermal module 2. Therefore, the working time is greatly shortened and the assembling process is facilitated.

Figure 10A:
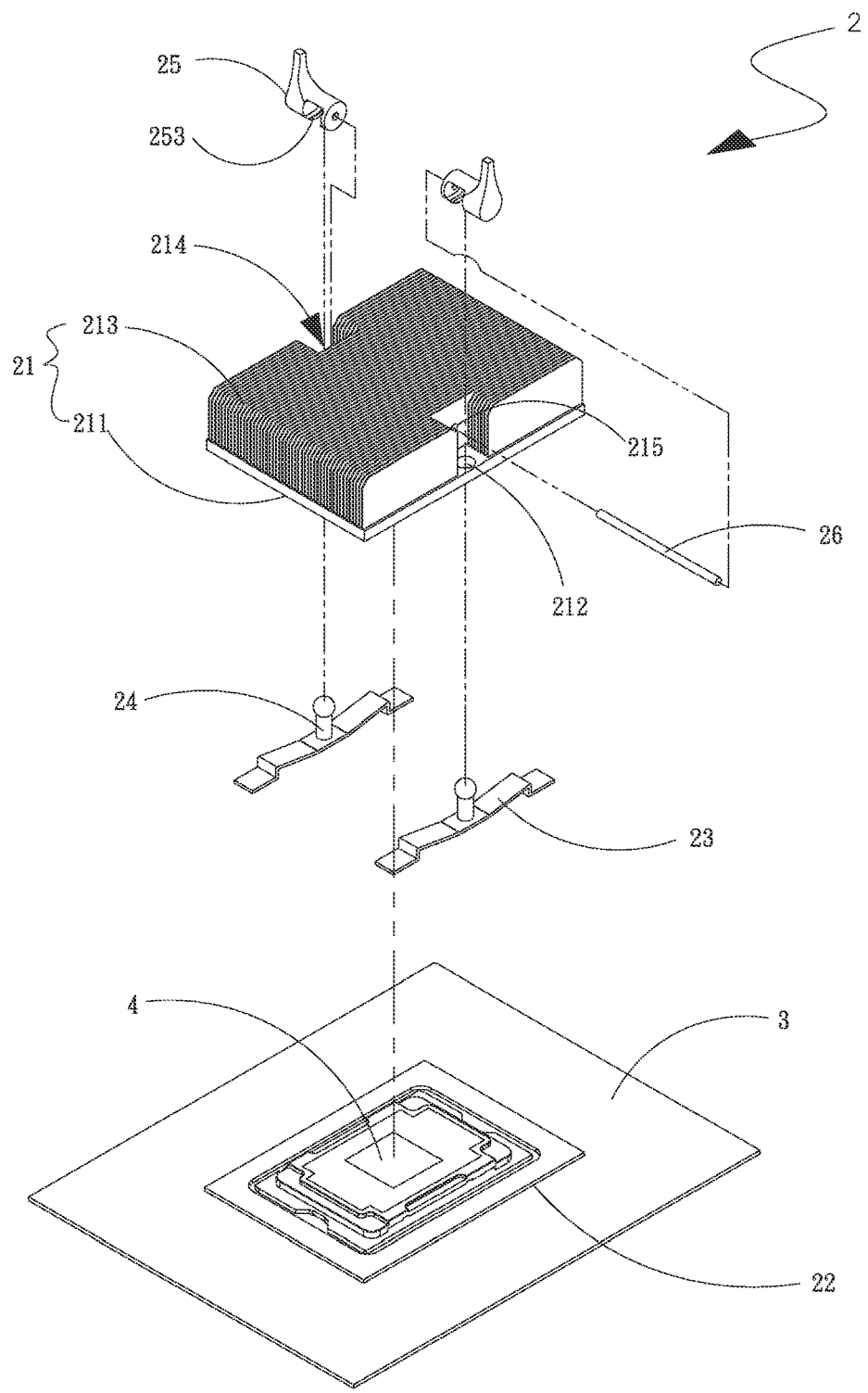
FIG. 10A is a perspective exploded view of a fourth embodiment of the thermal module assembling structure of the present invention.
Figure 10B:
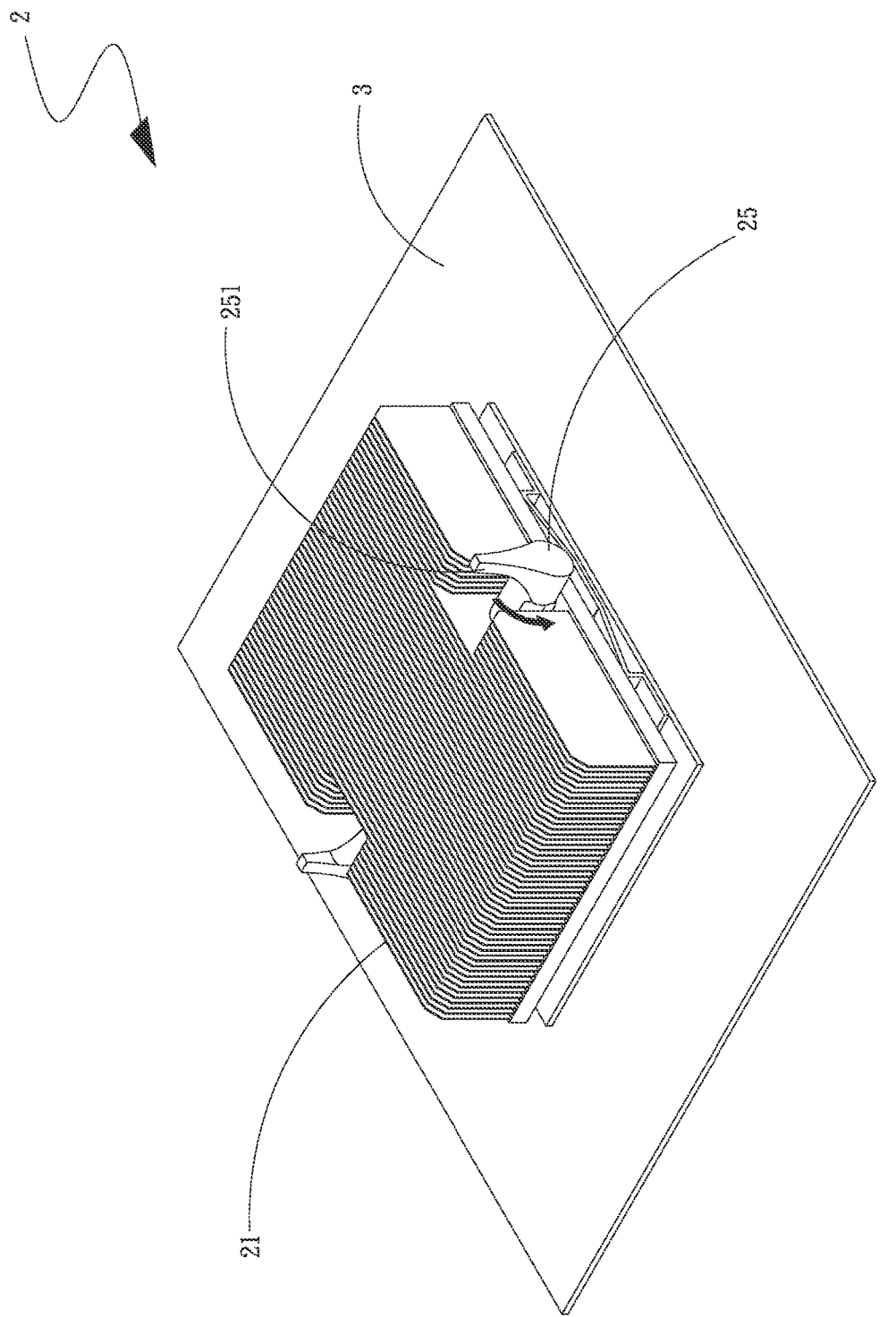
FIG. 10B is a perspective assembled view of the fourth embodiment of the thermal module assembling structure of the present invention.

Please now refer to FIGS. 10A and 10B. FIG. 10A is a perspective exploded view of a fourth embodiment of the thermal module assembling structure of the present invention. FIG. 10B is a perspective assembled view of the fourth embodiment of the thermal module assembling structure of the present invention. The fourth embodiment is partially identical to the first embodiment in component and relationship between the components and thus will not be repeatedly described. The fourth embodiment is mainly different from the first embodiment in that a fixing member 22 is further disposed on the substrate 3. The leaf springs 23 are disposed on two sides of the fixing member 22. The heat sink 21 is correspondingly assembled on the leaf springs 23. The engagement posts 24 are disposed on the leaf springs 23 corresponding to the perforations 212. The structure of this embodiment can also achieve the aforesaid effect.

In conclusion, in comparison with the conventional thermal module latch device, the present invention has the following advantages:
1. The assembling working time is greatly shortened.
2. The assembling process is facilitated.

The present invention has been described with the above embodiments thereof and it is understood that many changes and modifications in the above embodiments can be carried out without departing from the scope and the spirit of the invention that is intended to be limited only by the appended claims.

What is claimed is:

1. A thermal module assembling structure comprising:
   a heat sink having a base seat and multiple radiating fins disposed on the base seat, at least one perforation being formed on each of two opposite sides of the base seat;
   two leaf springs, the heat sink being correspondingly assembled on the leaf springs;
   at least one engagement post disposed on each leaf spring corresponding to a respective perforation and having a main body with two ends of the main body defining respectively a fixed end connected with the leaf spring and a free end;
   holding members, each holding member being slidably capped on the a respective engagement post with the engagement post inlaid in the holding member, the holding member having a first end which, when provided with an external force, shifts the first end upward and downward and a second end formed with a socket having an internal receiving space, a raised section being formed in the receiving space of the holding member, the free end of the respective engagement post being inlaid in the receiving space and connectable with the raised section; and
   a shaft rod passing through the heat sink, two ends of the shaft rod being respectively connected with one of the holding members.

2. The thermal module assembling structure as claimed in claim 1, further comprising a fixing member, the leaf springs being disposed on two sides of the fixing member.

3. The thermal module assembling structure as claimed in claim 1, wherein each leaf spring is formed with at least one hole corresponding to the respective perforation, the at least one engagement post being correspondingly passed through the respective perforation and connected to the at least one hole of the respective leaf spring.

4. The thermal module assembling structure as claimed in claim 3, wherein the fixed end is connected with an assembling member and correspondingly connected to the at least one hole of the respective leaf spring and the free end is correspondingly passed through the respective perforation of the base seat and slidably inlaid in the holding member.

5. The thermal module assembling structure as claimed in claim 1, wherein each of two opposite sides of the heat sink is formed with a recess, each perforation being formed on the base seat in a position where the respective recess is formed.

6. The thermal module assembling structure as claimed in claim 1, further comprising a connection member connected with the first ends of the holding members, the connection member being U-shaped or C-shaped.

7. The thermal module assembling structure as claimed in claim 6, wherein the connection member has a grip section in a middle thereof, a first connection section and a second connection section respectively outward extending from two ends of the grip section, the first and second connection sections being respectively connected with the first ends of the holding members.

8. The thermal module assembling structure as claimed in claim 7, wherein the heat sink is further formed with a shaft hole passing through the radiating fins, the shaft rod passing through the shaft hole.

9. The thermal module assembling structure as claimed in claim 2, wherein the fixing member is mounted on a substrate.

* * * * *